April 29, 1952 R. E. RICKETTS 2,594,347

INTERMEDIATE FREQUENCY REJECTION CIRCUIT

Filed Oct. 6, 1949

Inventor:
Robert E. Ricketts.

by Merton D. Morse
His Attorney

Patented Apr. 29, 1952

2,594,347

UNITED STATES PATENT OFFICE 2,594,347

INTERMEDIATE FREQUENCY REJECTION CIRCUIT

Robert E. Ricketts, Auburn, N. Y., assignor to General Electric Company, a corporation of New York Application October 6, 1949, Serial No. 119,928

2 Claims. (Cl. 250—20)

My invention relates to radio receiving circuits of the superheterodyne type and more particularly to intermediate frequency rejection networks therein.

It is desirable in a superheterodyne receiving circuit to achieve a relatively high conversion gain in the mixer or converter tube thereof in order to secure good operating efficiency of the circuit. The use of a triode as a mixer tube, as is well known, provides a relatively high degree of sensitivity and if, therefore, sufficient conversion gain may be realized in a triode, it may be desirable to employ such a tube as a mixer in a number of applications.

It is accordingly a principal object of my invention to provide a new and improved arrangement in a superheterodyne receiver circuit to increase the conversion gain in a triode mixer by preventing feedback of the intermediate frequency therein through the interelectrode capacitance of the triode. To accomplish this result I provide an electrical short-circuit from the input electrode of the triode to ground in the form of a network resonant to the intermediate frequency of the circuit.

Figure 1:
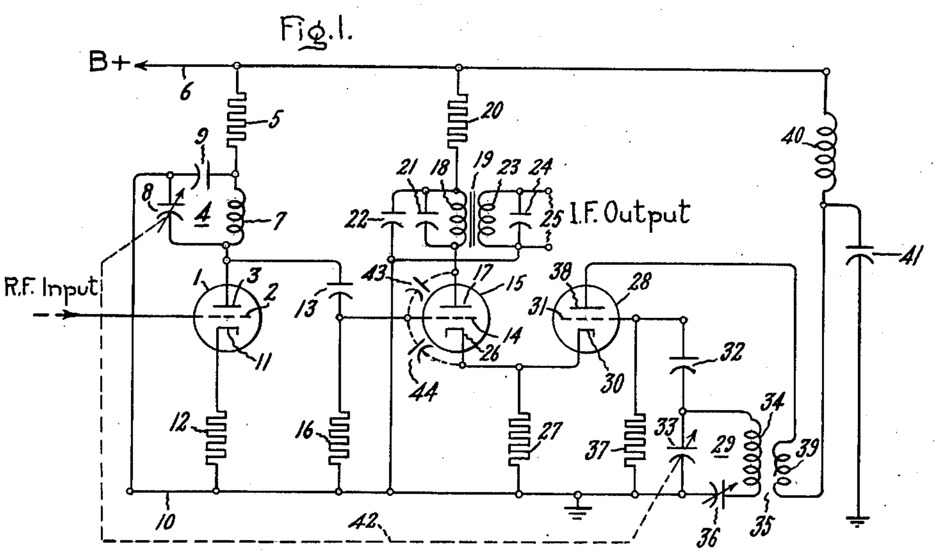
Figure 2:
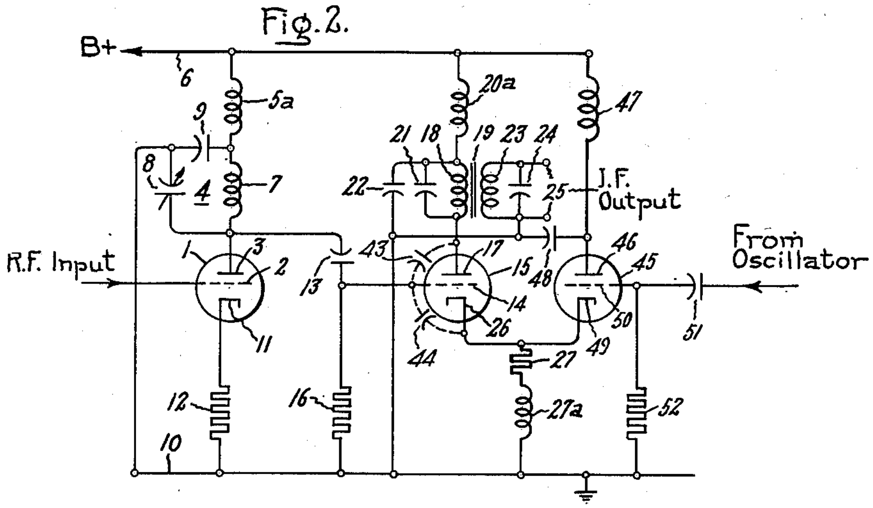
Figure 1A:
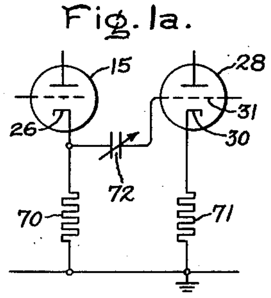

My invention, together with other objects and advantages thereof, will be better understood from a consideration of the following description taken in connection with the accompanying drawing and the appended claims, in which the features of my invention believed to be novel are more particularly set forth. In the drawing, Fig. 1 is a schematic diagram of a portion of a superheterodyne receiver circuit including a triode mixer and an oscillator, and embodying an intermediate frequency rejection network in accordance with my invention; Fig. 1*a* is a modification of a portion of Fig. 1; and Fig. 2 is a schematic diagram of a similar circuit except arranged for use with an external oscillator.

Referring now to Fig. 1, there is shown a portion of a conventional superheterodyne radio receiving circuit including principally a tunable radio frequency amplifier, a mixer section, and a tunable local oscillator. The combination of elements shown is arranged to receive an input signal of radio frequency and to convert this input signal to an output signal of intermediate frequency to be supplied to additional amplifier and detector stages. The elements shown and their general interrelation and operation are well known in the art.

In general, a triode electron discharge device 1 is employed as a radio frequency amplifier having a tunable anode circuit. An input signal of radio frequency, as from an antenna or preceding amplifier stage, is impressed on control electrode or grid 2 of triode 1. Anode 3 thereof is connected through a tunable network 4 of impedance elements and a decoupling resistor 5 to the positive terminal 6 of a suitable high-voltage plate supply of conventional type, the negative terminal of the supply forming a ground connection 10.

Network 4 comprises an inductance 7, a variable capacitance 8, and a capacitance 9. Inductance 7 and capacitance 8 are connected to plate 3. Capacitance 8 is connected to one terminal of capacitance 9, the other end thereof being connected to inductance 7. Resistance 5 is connected to the junction point of inductance 7 and capacitance 9. The junction point of capacitances 8 and 9 is connected to ground 10. Resistance 5 and capacitance 9 form a decoupling circuit to conduct undesired frequency components in the supply voltage to ground. Cathode 11 of triode 1 is connected to ground through a cathode resistance 12.

An input signal impressed on grid 2 causes a variable current to flow in tuned network 4, the frequency of the current being determined by the resonant frequency of network 4 as selected by adjusting capacitance 8. The capacitance range of tuning capacitance 8 is such that the resonant frequency of network 4 may be varied over the desired tuning range of the receiver.

Anode 3 of triode 1 is connected through a coupling capacitor 13 to the grid 14 of a second triode 15 employed as a mixer element. A grid resistance 16 is connected from the junction of capacitance 13 and grid 14 to ground. Anode 17 of triode 15 is connected through the primary winding 18 of an intermediate frequency transformer 19 and a resistance 20 to positive terminal 6. A capacitance 21 is connected in parallel relation with winding 18. The combination of capacitance 21 and winding 18 is tuned to be resonant at the intermediate frequency of the circuit.

A capacitance 22 is connected from the junction of resistance 20 and winding 18 to ground to form a decoupling path as in the case of triode 1. Transformer 19 is provided with a secondary winding 23, one end of which is connected to ground. A capacitance 24 is connected in parallel relation with winding 23, the combination of winding 23 and capacitance 24 being tuned to the intermediate frequency of the circuit. The intermediate frequency output of the circuit appears across terminals 25 of winding 23.

Attention is next directed to the oscillator portion of the circuit. In particular, a third triode 28 is employed in connection with a tunable network 29 of impedance elements to form a local oscillator of conventional type for use in providing a frequency to be mixed with the signal frequency to form the intermediate frequency.

Cathode 30 of triode 28 is connected to cathode 26 of triode 15, the junction of cathodes 26 and 30 being connected to ground through a common cathode resistance 27. Grid 31 of triode 28 is connected through a capacitance 32 to tunable network 29 which includes a variable capacitance 33 and winding 34 of feedback transformer 35. Capacitance 33 and winding 34 are connected to capacitance 32. Capacitance 33 is connected to ground. Winding 34 is connected to ground through a variable padding capacitance 36. A resistance 37 is connected from grid 31 to ground.

The anode 38 of triode 28 is connected in series with the other winding 39 of transformer 35 and a radio frequency choke 40 to positive terminal 6. A capacitance 41 is connected from the junction of winding 39 and choke 40 to ground.

The range of tuning capacitance 33 is such that the resonance frequency of network 29 may be varied over a range substantially equal to the frequency range of tunable network 4. The frequency range of network 29, however, differs from the range of network 4 by an amount which is the desired intermediate frequency, as is well known. Variable capacitance 33 is preferably mechanically ganged with variable capacitance 8, as indicated by broken line 42, so that both capacitances may be adjusted simultaneously to maintain a substantially constant frequency difference between the input signal and the frequency of the oscillator. Padding capacitance 36 may be conveniently employed to adjust initially the frequency of the oscillator with respect to the input signal frequency.

In the operation of the superheterodyne receiving circuit shown in Fig. 1, it is assumed that a radio frequency input signal is impressed on grid 2. Resonant network 4 in the anode circuit of triode 1 is tuned to the frequency of the input signal to be received by adjusting variable capacitance 8. When the resonant frequency of network 4 corresponds to the desired input frequency a current having the frequency of the input signal and representing an amplification thereof flows from positive terminal 6 through resistance 5, network 4, from anode 3 to cathode 11 in triode 1, and resistance 12 to ground connection 10.

The amplified input signal is impressed on grid 14 of triode 15 through coupling capacitance 13. Triode 15, as previously mentioned, serves as a mixer to combine the input signal frequency with the output frequency of a local oscillator to form the intermediate frequency of the receiver. The local oscillator, which comprises principally triode 28 and resonant network 29, is made to have an output frequency differing at all times from the input signal frequency to which the receiver is tuned by the amount of the desired intermediate frequency. Since variable capacitance 33 of network 29 is mechanically ganged to tuning capacitor 8, the frequency output of the oscillator is varied simultaneously with the tuning of the receiver. The difference in resonant frequencies 4 and 29 may be initially established by adjusting padding capacitance 36.

The local oscillator functions in a conventional manner to provide a current from positive terminal 6 through choke 40, winding 39, anode 38 and cathode 30 of triode 28, and resistance 27 to ground 10. In the oscillator shown the tuning is accomplished through the grid circuit and oscillations are sustained through action of feedback transformer 35. The output of the local oscillator is impressed on cathode 26 of mixer triode 15 by the use of cathode resistance 27. Thus in mixer 15 two frequencies are present, namely, the input frequency as impressed on grid 14 and the local oscillator frequency as impressed on cathode 26. It is the function of mixer 15 to combine these frequencies through heterodyne action to provide an output current having an intermediate frequency equal to the difference of the input and local oscillator frequencies.

While a common cathode resistance 27 is shown in Fig. 1 to connect cathodes 26 and 30 of triodes 15 and 28, respectively, to ground, in certain applications it may be desirable to employ separate cathode resistance from cathodes 26 and 30 to ground. Such an arrangement is shown in Fig. 1*a*, which represents a portion of Fig. 1 including triodes 15 and 28, wherein resistances 70 and 71 are connected from cathodes 26 and 30, respectively, to ground. A coupling capacitance 72 is connected from grid 31 of oscillator triode 28 to cathode 26 of mixer triode 15 to provide for impressing the oscillator voltage on the mixer. A coupling arrangement of this type is desirable in some instances since by a proper selection of the value of the coupling capacitance, the amount of oscillator voltage impressed on mixer triode 15 may be adjusted to secure uniform gain over the tuning range of the receiver.

The intermediate frequency output of the circuit is derived through intermediate frequency transformer 19. Both the input and output circuits of transformer 19 are tuned to the intermediate frequency by the use of capacitors 21 and 24 respectively. A current having the intermediate frequency of the circuit is made to flow from positive terminal 6 through resistance 20, the tuned combination of winding 18 and capacitance 21, anode 17 and cathode 26 of triode 15, and resistance 27 to ground. The intermediate frequency output appears across terminals 25 of winding 23.

In the use of a triode as a mixer it is desirable to obtain a high degree of gain, commonly termed conversion gain, in the triode to secure good operating efficiency in the superheterodyne circuit. However, the presence of certain inherent interelectrode capacitances in a triode frequently provides conducting paths which permit degenerative feedback in the system, which in turn results in a reduction in the conversion gain of the triode. In Fig. 1 interelectrode capacitances 43 and 44 are represented as existing in triode 15 between grid 14 and anode 17 and between grid 14 and cathode 26, respectively.

In particular, feedback occurs between anode 17 and grid 14 through interelectrode capacitance 43 and may also occur from cathode 26 to grid 14 through interelectrode capacitance 44. Such feedback results in a reduction in the conversion gain of the triode 15. In accordance with my invention I provide, in effect, a short-circuit from grid 14 to ground for signals of intermediate frequency. I provide such a short-circuit or conducting path by tuning the combination of coupling capacitance 13 and inductance 7 to the intermediate frequency of the circuit. Thus signals of intermediate frequency tending to feed back to grid 14 are conducted to ground through the series resonant combination of capacitance 13 and inductance 7, and capacitance 9. It will be understood that capacitance 9 is relatively large and therefore has no appreciable effect on the series resonance characteristic of capacitance 13 and inductance 7.

By the use of a short-circuiting path to ground, tuned to the intermediate frequency of the circuit in accordance with my invention, the conversion gain of a mixer triode may be substantially increased. While I do not wish to be limited to any particular theory of operation, I believe that such increased gain is secured by causing the mixer triode to act as a grounded-grid amplifier at the intermediate frequency by effectively grounding the grid thereof through a conducting path tuned to the intermediate frequency. In addition, the resonant combination of impedance elements forming the conducting path need not be sharply tuned to the intermediate frequency but may be broadly tuned thereto and once tuned need not be further adjusted. It will be noted that a short-circuiting path to ground is provided by the use of elements which are otherwise required in the circuit and without the addition of extra elements.

Referring now to Fig. 2 there is shown an embodiment of my invention similar to the above-described embodiment thereof but employed in connection with a superheterodyne receiving circuit differing in certain respects from the circuit of Fig. 1. The circuit shown in Fig. 2 has been found to be particularly useful in the signal frequency range of 50 to 200 megacycles. Like numerals are assigned to corresponding elements in Figs. 1 and 2. A triode 1 having a tuned anode circuit serves as a radio frequency amplifier. A tunable network 4 comprising an inductance 7 and a variable capacitance 8, and a radio frequency choke 5*a* are connected in series with the anode 3 of triode 1 and positive terminal 6 of a suitable high-voltage source. A radio frequency input signal to be received is impressed on grid 2 of triode 1.

The input signal, as amplified in triode 1, is impressed on grid 14 of a mixer triode 15 through a coupling capacitance 13. The general arrangement of the circuit of mixer triode 15 in Fig. 2 and the intermediate frequency output circuit associated therewith is similar to the arrangement of the corresponding circuits in Fig. 1, except that a radio frequency choke 20*a* is connected in the anode circuit of triode 15 in place of resistance 20 of Fig. 1 and a choke 27*a* is connected in series with cathode resistance 27 of Fig. 1.

In the arrangement of Fig. 2 local oscillations are provided by a separate oscillator which is not shown. The oscillator is arranged to have a frequency output which differs at all times from the input frequency to be received, as selected by tuning capacitance 8, by the amount of the desired intermediate frequency. The output of the oscillator is coupled into mixer triode 15 through a coupling stage of the cathode-follower type, a triode 45 being employed for this purpose. Anode 46 of triode 45 is connected through a radio frequency choke 47 to positive terminal 6. A bypass capacitor 48 is connected from the junction of anode 46 and choke 47 to ground. Cathode 49 of triode 45 is connected to the junction of cathode 26 of triode 15 and cathode choke 27*a*. The amplified output of the separate oscillator is impressed on grid 50 of triode 45 through a coupling capacitance 51. Grid 50 is connected to ground through a suitable grid resistance 52.

As in the case of the arrangement shown in Fig. 1, an amplified signal of the desired input frequency is impressed on control electrode 14 of mixer triode 15, while amplified local oscillations from the separate oscillator are impressed on cathode 26 of triode 15 through the use of cathode resistance 27 and choke 27*a*. The value of inductance 27*a* is preferably selected so that in combination with the input capacitance of triode 45 a broadly tuned circuit is formed which is resonant in the middle of the range over which triode 45 acts as a coupling stage. I have found that by providing such a condition the efficiency of cathode coupling triode 45 may be increased at relatively high frequencies.

It is the function of triode 15 to combine the input signal and local oscillations to provide an output having the intermediate frequency of the circuit. The intermediate frequency output is derived from the circuit through an intermediate frequency transformer 19 having input and output circuits tuned to the intermediate frequency. The intermediate frequency output appears across terminals 25 of secondary winding 23 of transformer 19.

Degenerative feedback of the intermediate frequency output tends to occur in mixer triode 15 in Fig. 2, due to the interelectrode capacitances 43 and 44 therein, in the same manner as in Fig. 1. To minimize such degenerative feedback and increase the conversion gain of triode 15, a short-circuiting path to ground tuned to the intermediate frequency of the circuit is provided. In particular coupling capacitance 13 and inductance 7 are again tuned to series resonance at the intermediate frequency. Thus signals of intermediate frequency tending to feed back from the output of triode 15 to grid 14 thereof tend to be conducted to ground through the series-resonant combination of coupling capacitance 13 and inductance 7, and capacitance 9.

I have found in certain cases that an increase in conversion gain of 100 percent may readily be realized by my invention. By employing elements which are normally present in a receiver circuit to form a tuned path, such as coupling capacitance 13 and inductance 7, an increase in conversion gain is effected without adding appreciably to the cost of the apparatus and at the same time materially improving the efficiency thereof.

While I have described a preferred embodiment of my invention, it will be understood that my invention may well take other forms and I, therefore, aim in the appended claims to cover all such changes and modifications as fall within the true spirit and scope of my invention.

What I claim as new and desire to secure by Letters Patent of the United States is:

1. In a superheterodyne receiver, means for tuning said receiver to a radio frequency input signal including a tunable parallel resonant network having an inductance and a variable capacitance therein, mixing means including an electron discharge device having a cathode, an anode and a control electrode, an impedance means including a resistance connecting one terminal of said parallel resonant network to said cathode, means for connecting said one terminal to the negative terminal of a source of unidirectional potential, a second capacitance having one electrode thereof connected to the other terminal of said parallel resonant network and the other electrode thereof connected to said control electrode, thereby supplying said input signal to said mixing, means, means connected in shunt with said impedance means for supplying variable frequency local oscillations thereto, means to maintain a substantially constant frequency difference between said input signal and said oscillations, and a tuned network having one terminal connected to said anode, means for connecting the other terminal of said tuned network to the positive terminal of said source of unidirectional potential, said tuned network being tuned to the intermediate frequency derived from said mixing means by the heterodyning action of said input signal and said local oscillations, said second capacitance and said inductance being tuned to series resonance at said intermediate frequency and forming a path to conduct to said one terminal of said parallel resonant network signals of said intermediate frequency tending to feed back to said control electrode through the interelectrode capacitance of said electron discharge device, whereby the conversion gain of said device is substantially increased.

2. In a superheterodyne receiver, means for tuning said receiver to a radio frequency input signal including a tunable parallel resonant network having an inductance and a variable capacitance therein, mixing means including an electron discharge device having a cathode an anode and a control electrode, a resistance connecting one terminal of said parallel resonant network to said cathode, means for connecting said one terminal to the negative terminal of a source of unidirectional potential, a second capacitance having one electrode thereof connected to the other terminal of said parallel resonant network and the other electrode thereof connected to said control electrode, thereby supplying said input signal to said mixing means, means connected in shunt with said impedance means for supplying variable frequency local oscillations thereto, a tuned network having one terminal connected to said anode, means for connecting the other terminal of said tuned network to the positive terminal of said source of unidirectional potential, said tuned network being tuned to the intermediate frequency derived from said mixing means by the heterodyning of said input signal and said local oscillations, said second capacitance and said inductance being tuned to series resonance at said intermediate frequency and forming a path to conduct to said one terminal of said parallel resonant network signals of said intermediate frequency tending to feed back to said control electrode through the interelectrode capacitance of said electron discharge device, whereby the conversion gain of said device is substantially increased.

ROBERT E. RICKETTS.

REFERENCES CITED

The following references are of record in the file of this patent:

UNITED STATES PATENTS

| Number | Name | Date |
|---|---|---|
| 1,881,235 | MacDonald | Oct. 4, 1932 |
| 1,968,259 | Posthumus | July 31, 1934 |
| 2,026,075 | Wheeler | Dec. 31, 1935 |
| 2,141,774 | Truefitt | Dec. 27, 1938 |
| 2,252,609 | Beck | Aug. 12, 1941 |
| 2,278,030 | Weber | Mar. 31, 1942 |